(12) United States Patent
Hashimoto (10) Patent No.: US 8,981,439 B2
(45) Date of Patent: Mar. 17, 2015

(54) SOLID-STATE IMAGING DEVICE AND IMAGE CAPTURING SYSTEM

(71) Applicant: Canon Kabushiki Kaisha, Tokyo (JP)

(72) Inventor: Kouhei Hashimoto, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 14/038,468

(22) Filed: Sep. 26, 2013

(65) Prior Publication Data

US 2014/0091378 A1    Apr. 3, 2014

(30) Foreign Application Priority Data

Oct. 2, 2012    (JP) .................................. 2012-220386

(51) Int. Cl.
*H01L 31/062* (2012.01)
*H01L 27/146* (2006.01)

(52) U.S. Cl.
CPC ................................ *H01L 27/14623* (2013.01)
USPC ................................. 257/294; 257/E27.133

(58) Field of Classification Search
USPC .................................................. 257/233, 294
See application file for complete search history.

(56) References Cited

U.S. PATENT DOCUMENTS 7,847,361 B2 * 12/2010 Kokusenya .................... 257/435
8,184,189 B2 *  5/2012 Tamura .......................... 257/294

FOREIGN PATENT DOCUMENTS

| JP | H04-091472 A | 3/1992 |
| JP | 2000-124438 A | 4/2000 |
| JP | 2005-243946 A | 9/2005 |
| JP | 2006-210595 A | 8/2006 |
| JP | 2007-129192 A | 5/2007 |
| JP | 2007-157912 A | 6/2007 |
| JP | 2009-105358 A | 5/2009 |
| JP | 2010-165753 A | 7/2010 |
| JP | 2011-204992 A | 10/2011 |

* cited by examiner

*Primary Examiner* — Chandra Chaudhari
(74) *Attorney, Agent, or Firm* — Canon USA, Inc. IP Division (57) ABSTRACT

A solid-state imaging device includes a photoelectric converting portion including a first semiconductor region capable of accumulating a signal charge, a second semiconductor region of the same conductivity type as the first semiconductor region, a gate electrode provided between the first and second semiconductor regions, and an insulating layer provided on the first semiconductor region, the second semiconductor region, and the gate electrode. The solid-state imaging device further includes a first light-shielding portion including a metal portion provided in an opening or a trench of the insulating layer between the first and second semiconductor regions, and a second light-shielding portion including a metal portion provided on the insulating layer on the second semiconductor region.

14 Claims, 7 Drawing Sheets

SOLID-STATE IMAGING DEVICE AND IMAGE CAPTURING SYSTEM

BACKGROUND OF THE INVENTION

1. Field of the Invention

One disclosed aspect of the embodiments relates to a solid-state imaging device and an image capturing system.

2. Description of the Related Art

An active pixel-type solid-state imaging device represented by a CMOS image sensor, which is configured to have a global electronic shutter function and pixels for focus detection, has been proposed.

The global electronic shutter function starts and ends the photocarrier accumulation of all of a plurality of pixels arranged in a matrix at the same time. A structure of the solid-state imaging device, whose pixel has a photoelectric converting portion and a charge storage portion for holding electric carriers photoelectrically converted for a certain period of time, has been studied in order to perform the global electronic shutter function. The charge storage portion for the global electronic shutter function holds electric carriers for the period from the completion of the photocarrier accumulation to a read-out thereof. During this time, a mixture of the electric carriers generated in a portion other than the photoelectric converting portion into the charge storage portion causes a noise signal, and this may degrade image quality. Japanese Patent Application Laid-Open No. 2007-157912 discloses a configuration having a light-shielding layer to cover a charge storage portion and a gap to surround the charge storage portion against such mixture of the electric carriers.

Japanese Patent Application Laid-Open No. 2009-105358, in which a solid-state imaging device is configured to have a pixel for focus detection, also discloses a light-shielding layer having a slit provided for the pixel for focus detection.

SUMMARY OF THE INVENTION

One aspect of the embodiments provides a solid-state imaging device that includes a photoelectric converting portion including a first semiconductor region capable of accumulating a signal charge, a second semiconductor region of the same conductivity type as the first semiconductor region, a gate electrode provided between the first and second semiconductor regions, and an insulating layer provided on the first semiconductor region, the second semiconductor region, and the gate electrode, wherein the solid-state imaging device further includes a first light-shielding portion including a metal portion provided in an opening or a trench of the insulating layer between the first and second semiconductor regions, and a second light-shielding portion including a metal portion that is provided on the insulating layer on the second semiconductor region and has a lower surface in contact with the upper surface of the insulating layer.

Another aspect of the embodiments includes: a photoelectric converting portion for focus detection; a floating diffusion portion to which electric carriers are transferred from the photoelectric converting portion; a gate electrode provided between the photoelectric converting portion and the floating diffusion portion; an insulating layer provided on the photoelectric converting portion, the floating diffusion portion, and the gate electrode; a first light-shielding portion including a metal portion provided in a trench or an opening of the insulating layer on the photoelectric converting portion; and a second light-shielding portion that is provided on the insulating layer, has a lower surface in contact with the upper surface of the insulating layer, includes a metal portion provided on the photoelectric converting portion, and forms an opening for the focus detection.

Further features of the disclosure will become apparent from the following description of exemplary embodiments (with reference to the attached drawings).

DESCRIPTION OF THE EMBODIMENTS

Since the gap described in Japanese Patent Application Laid-Open No. 2007-157912 is transparent, a light-shielding performance may not be achieved depending on the angle of light. In the solid-state imaging device described in Japanese Patent Application Laid-Open No. 2009-105358, light reflected on the light-receiving surface of a photoelectric converting portion may also stray by being reflected on the lower surface of the light-shielding layer having a slit. Thus, improvement of light-shielding performance is also desired in the solid-state imaging device described in Japanese Patent Application Laid-Open No. 2009-105358 as in the solid-state imaging device having the global electronic shutter function.

Accordingly, an object of the embodiments is to provide a solid-state imaging device having a high light-shielding performance.

First to fourth embodiments relate to a solid-state imaging device including a pixel that has a photoelectric converting portion including a first semiconductor region capable of accumulating a signal charge, a second semiconductor region of the same conductivity type as that of the first semiconductor region, a gate electrode, and an insulating layer provided on the gate electrode. The solid-state imaging device includes a first light-shielding portion including a metal portion provided in an opening or a trench of the insulating layer between the first and second semiconductor regions and a second light-shielding portion including a metal portion provided on the insulating layer on the second semiconductor region. A fifth embodiment relates to a solid-state imaging device having a pixel for focus detection. The solid-state imaging device includes a first light-shielding portion including a metal portion provided in an opening or a trench of an insulating layer on the photoelectric converting portion of the pixel for focus detection, and a second light-shielding portion that is provided on the insulating layer, includes a metal portion provided on the photoelectric converting portion, and forms an opening for the focus detection. Such a configuration may provide a solid-state imaging device having a high light-shielding performance.

Here, the light-shielding portion may not be intended to completely shield incident light. The light-shielding portion may be any one which reduces transmittance for light of at least a certain wavelength range; for example, the light-shielding portion may be one that reflects or absorbs any light of a certain wavelength range. Note that a certain wavelength range is, for example, in the range of about 400 nm to about 750 nm in a solid-state imaging device using visible light.

The embodiments will hereinafter be described in detail with reference to the accompanying drawings.

(First Embodiment)

A solid-state imaging device of the first embodiment will be described with reference to FIGS. 1A, 1B, and 2A to 2C.

Figure 1A:
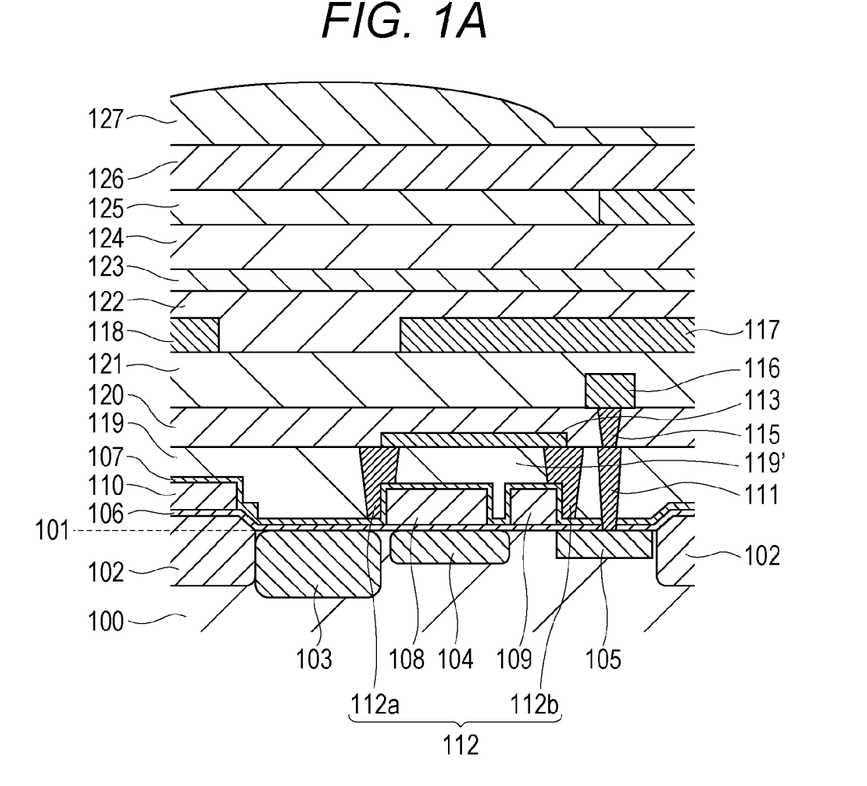
FIG. 1A is a schematic cross-sectional view illustrating a solid-state imaging device of a first embodiment.
Figure 1B:
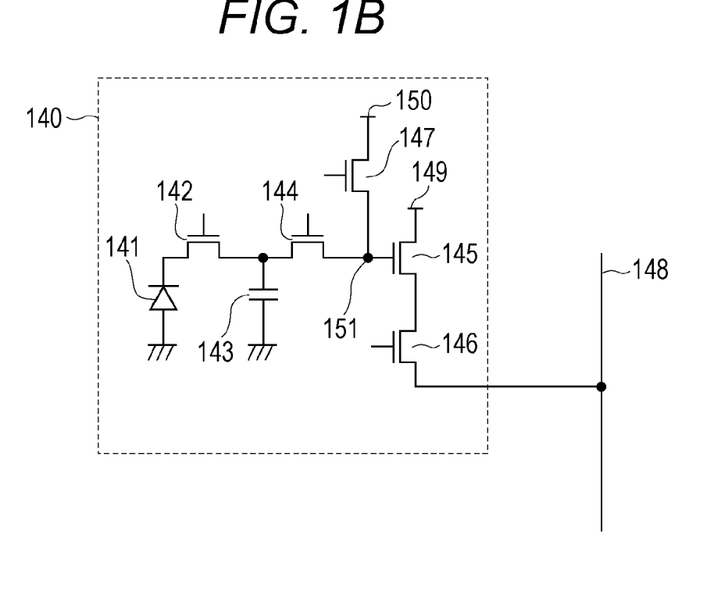
FIG. 1B is a circuit diagram of a pixel illustrating the solid-state imaging device of the first embodiment.

FIG. 1B illustrates a circuit diagram of a single pixel of the solid-state imaging device of the present embodiment. In FIG. 1B, a pixel 140 includes a photoelectric converting portion 141, a charge storage portion 143, a transfer transistor 142, a transfer transistor 144, an amplification transistor 145, a selection transistor 146, and a reset transistor 147. In the pixel 140, a node 151 including a floating diffusion portion (hereinafter "FD portion") is electrically connected to the gate electrode of the amplification transistor 145. The node 151 is reset to a desired potential by the reset transistor 147. Power supplies 149 and 150 are wirings for supplying a predetermined voltage to the amplification transistor 145 and the reset transistor 147, respectively. A signal line 148 is provided with a constant current source (not illustrated), which constitutes a source follower circuit together with the amplification transistor 145. In the present embodiment, the pixel 140 is configured to include a single photoelectric converting portion 141 and is the smallest repeating unit of the configuration of the solid-state imaging device.

FIG. 1A, which is a schematic cross-sectional view illustrating the solid-state imaging device, illustrates portions including the photoelectric converting portion 141, the charge storage portion 143, and the FD portion illustrated in FIG. 1B. The structure of the solid-state imaging device of the present embodiment will hereinafter be described with reference to FIGS. 1A and 1B. A gate electrode 108 is disposed between a semiconductor region 103 constituting the photoelectric converting portion 141 and a semiconductor region 104 constituting the charge storage portion 143. The gate electrode 108 provides the gate electrode of the transfer transistor 142. A gate electrode 109 is disposed between the semiconductor region 104 constituting the charge storage portion 143 and a semiconductor region 105 constituting the FD portion. The gate electrode 109 provides the gate electrode of the transfer transistor 144. In the present embodiment, the gate electrode 108 extends over the semiconductor region 104, and constitutes a MOS capacitance together with the semiconductor region 104. Also in the present embodiment, the semiconductor regions 103, 104, and 105 are formed in a semiconductor substrate 100. It is assumed, for example, that the conductivity of the semiconductor regions 103, 104, and 105 is n-type, and the conductivity of the semiconductor substrate 100 is p-type, where the semiconductor region 103, the semiconductor region 104, and the semiconductor region 105 are assumed to be a first semiconductor region, a second semiconductor region, and a third semiconductor region, respectively.

In FIG. 1A, a surface 101 of the semiconductor substrate 100 includes a light receiving surface of the photoelectric converting portion 141. An element isolation region 102 is provided on the surface side of the semiconductor substrate 100. An insulating layer 106 made of, for example, silicon oxide is provided on the element isolation region 102 and the semiconductor substrate 100. The insulating layer 106 formed under the gate electrode 108 and the gate electrode 109 also functions as a gate insulating layer. A wiring 110 is made of the same material, e.g., polysilicon, as the gate electrodes 108 and 109. The wiring 110 may be formed in the same layer as the gate electrodes 108 and 109. An insulating layer 107, which covers the gate electrode 108, the gate electrode 109 and the wiring 110, is provided on the insulating layer 106. The insulating layer 107 is made of, for example, silicon nitride. An insulating layer 119 made of, for example, Boron Phosphorous Silicate Glass (BPSG) is provided on the insulating layer 107.

A plug 111 made of metal is provided in the opening of the insulating layer 119. The plug 111 is used to electrically connect the semiconductor region 105 and a wiring 116. On the insulating layer 119 and in the following order from the surface 101 side, insulating layers 120, 121 and 122, a protective layer 123, a planarizing layer 124, a color filter 125, a planarizing layer 126, and a microlens 127 are provided. A plug 115, which is made of metal for connecting the plug 111 and the wiring 116, is provided in an opening of the insulating layer 120, and the plugs 111 and 115 constitute the "stacked contact". The wiring 116 is provided on the insulating layer 120. Wirings 117 and 118 are provided on the insulating layer 121, wherein the wirings 117 and 118 may function as a light-shielding layer.

The solid-state imaging device of the present embodiment has a first light-shielding portion 112 and a second light-shielding portion 113. The first light-shielding portion 112 is provided in an opening of the insulating layer 119, and the second light-shielding portion 113 is provided on the insulating layer 119. The first light-shielding portion 112 includes a metal portion 112a provided in the opening of the insulating layer 119 between the semiconductor regions 103 and 104. In the present embodiment, the first light-shielding portion 112 also includes a metal portion 112b provided in the opening of the insulating layer 119 between the semiconductor regions 104 and 105. The second light-shielding portion 113 includes a metal portion provided above the semiconductor region 104. The second light-shielding portion 113 is in contact with the portions 112a and 112b in the present embodiment.

Such first and second light-shielding portions may reduce the light entering the semiconductor region 104 from the semiconductor region 103 side. That is, the light entering the charge storage portion 143 may be reduced.

While the first light-shielding portion 112 is provided in the opening of the insulating layer 119 in the present embodiment, the first light-shielding portion 112 may be provided in the trench of the insulating layer 119, and thus the first light-shielding portion 112 is located at least between the upper and lower surfaces of the insulating layer 119, wherein the opening means a through-hole of the insulating layer 119, and the trench has a remaining part of the insulating layer 119. When the first light-shielding portion 112 is provided in the opening, the insulating layer 119 is not present on the bottom surface of the light-shielding portion 112; when the first light-shielding portion 112 is provided in the trench, the bottom surface of the light-shielding portion 112 is in contact with the insulating layer 119.

The first light-shielding portion 112 and the second light-shielding portion 113 of the present embodiment are electrically in a floating state. Floating these light-shielding portions may reduce the parasitic capacitance of the wiring, etc. Any voltage may be applied to these light-shielding portions. At this time, if the light-shielding portions are connected to the gate electrode 108 or the gate electrode 109, a voltage may be applied to the gate electrode 108 or the gate electrode 109.

Furthermore, a portion 119' of the insulating layer 119 is provided between the second light-shielding portion 113 and the semiconductor substrate 100. Thus, having the portion 119' of the insulating layer 119 may reduce the fluctuation of the potential, for example, between other wirings and the gate electrode 108, between other wirings and the gate electrode 109, and between the gate electrode 108 and the gate electrode 109.

Figure 2A:
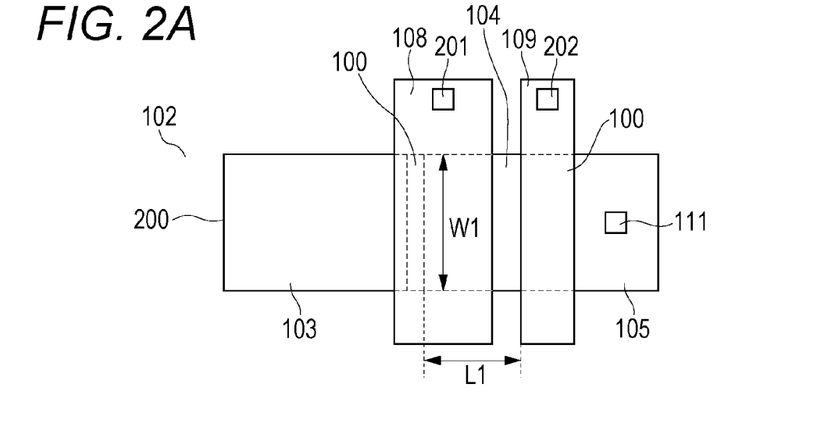
FIGS. 2A to 2C are schematic plan views illustrating the solid-state imaging device of the first embodiment.
Figure 2B:
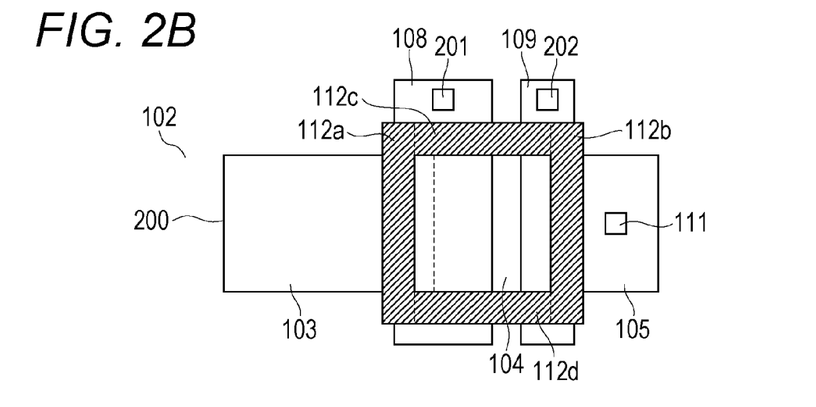
Figure 2C:
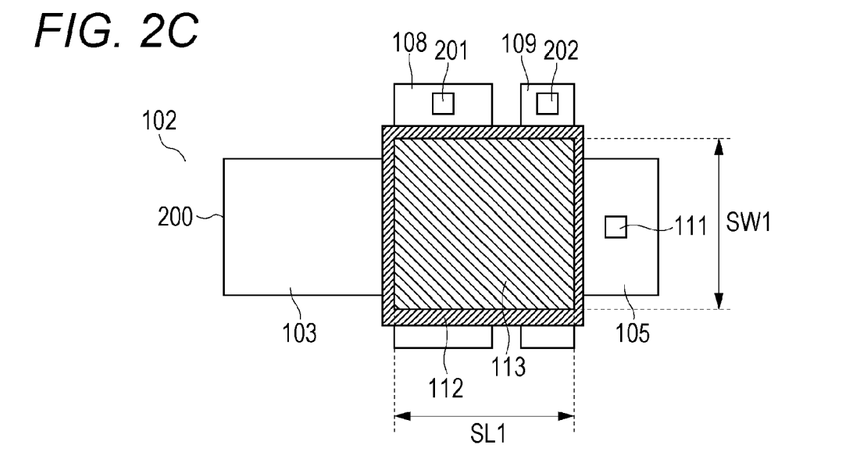

Referring now to FIGS. 2A, 2B, and 2C, the first light-shielding portion 112 and the second light-shielding portion 113 are described. FIGS. 2A, 2B, and 2C are schematic plan views illustrating the solid-state imaging device of the present embodiment. As in FIG. 1A, FIG. 2A is a schematic plan view illustrating a main part of the photoelectric converting portion, the charge storage portion, and the FD portion. FIG. 2B illustrates a configuration in which the first light-shielding portion 112 is added to FIG. 2A; FIG. 2C illustrates a configuration in which the second light-shielding portion 113 is added to FIG. 2B.

In FIG. 2A, an active region 200 surrounded by the element isolation region 102 includes a region where the semiconductor region 103 is formed, a region where the semiconductor region 104 is formed, and a region where the semiconductor region 105 is formed, each of the semiconductor regions being illustrated in FIG. 1A. The gate electrodes 108 and 109 are provided with connections 201 and 202, respectively. In these connections, metal plugs are connected to the gate electrodes 108 and 109.

The solid-state imaging device configured as above is provided with the first light-shielding portion 112 as illustrated in FIG. 2B. The first light-shielding portion 112 includes metal portions 112a, 112b, 112c, and 112d so as to surround the second semiconductor region. The portion 112a is provided on and across the semiconductor region 103 and the gate electrode 108. The portion 112b is provided on and across the gate electrode 109 and the semiconductor region 105. The portions 112c and 112d are provided on the element isolation region 102 outside the active region 200 to connect the portions 112a and 112b. That is, the orthogonal projection of the first light-shielding portion 112 including these portions onto a plane containing the light receiving surface of the photoelectric converting portion is frame-shaped.

The second light-shielding portion 113 is provided on the frame-shaped first light-shielding portion 112 as illustrated in FIG. 2C. The first light-shielding portion 112 and the second light-shielding portion 113 are arranged so as to partially overlap. The second light-shielding portion 113 has, for example, a width of SW1 and a length of SL1; the charge storage portion has, for example, a width of W1 and a length of L1. Although the relationship between the second light-shielding portion 113 and the charge storage portion may be that the width SW1 is less than or equal to the width W1 and the length SL1 is less than or equal to the length L1, it is desirable that the width SW1 is greater than the width W1 and the length SL1 is greater than the length L1. Such a relationship may further enhance the light-shielding performance of the charge storage portion. Furthermore, if the width SW1 is less than the width W1, for example, the portion 112 may be provided in the differential region between the widths W1 and SW1. A plurality of portions 112a may be provided. The second light-shielding portion 113 may have a slit therein. Such first and second light-shielding portions may reduce light entering the charge storage portion.

FIGS. 3A to 3F are schematic cross-sectional views illustrating a method of manufacturing the solid-state imaging device of the present embodiment. FIGS. 3A to 3F are drawings corresponding to the schematic cross-sectional view of FIG. 1A. In FIGS. 3A to 3F, the same elements as in FIG. 1A are denoted by the same reference numerals, and their descriptions are omitted.

Figure 3A:
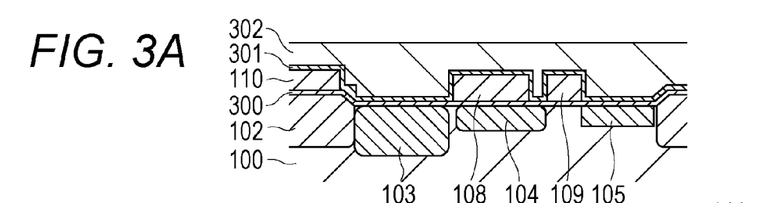
FIGS. 3A to 3F are schematic cross-sectional views illustrating a method of manufacturing the solid-state imaging device of the first embodiment.

In the step illustrated in FIG. 3A, the semiconductor substrate 100 such as silicon is provided, where the element isolation region 102, the semiconductor region 103, the semiconductor region 104, and the semiconductor region 105 are formed. On the semiconductor substrate 100, an insulating layer 300 made of silicon oxide, the gate electrode 108 made of polysilicon, the gate electrode 109 made of polysilicon, and the wiring 110 made of polysilicon are provided. The insulating layer 300 may also functions as a gate insulating layer. An insulating layer 301 made of silicon nitride is provided on the insulating layer 300, the gate electrode 108, the gate electrode 109, and the wiring 110. An insulating layer 302 made of BPSG is provided on the insulating layer 301. The semiconductor substrate 100 configured as above is provided in the present step. Such a semiconductor substrate 100 may be manufactured by a conventional method, and it will not be described in detail.

Figure 3B:
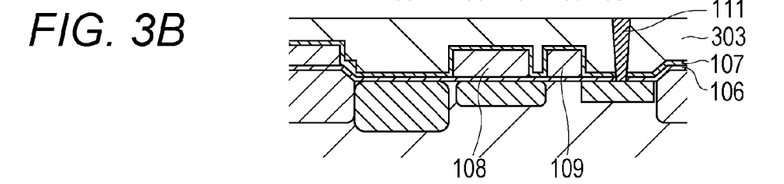

In the step illustrated in FIG. 3B, the plug 111 is formed. The plug 111, which is made of metal, is connected to the semiconductor region 105. In FIG. 3A, portions of the insulating layers 300, 301, and 302 corresponding to the semiconductor region 105 are provided with an opening, and the plug 111 is formed by providing the metal in the opening. For example, the plug 111 is made of tungsten and includes a barrier metal made of titanium or tantalum. The plug 111 may be formed, for example, by depositing a metal layer and by removing the excess portion by etching or chemical mechanical polishing (CMP) process. Note that the insulating layers 300, 301, and 302 are formed as the insulating layer 106, the insulating layer 107, and an insulating layer 303, respectively.

Figure 3C:
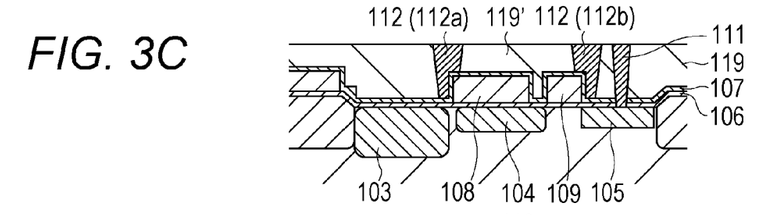

In the step illustrated in FIG. 3C, the first light-shielding portion 112 is formed. Here, only the portions 112a and 112b, which are made of metal, are illustrated. In FIG. 3B, the portions 112a and 112b may be formed by forming an opening in the insulating layer 303 and by providing metal. The portions 112c and 112d (not illustrated in FIG. 3C) also may be formed simultaneously with the portions 112a and 112b. For example, the portions 112a and 112b, as with the plug 111, are made of tungsten, include a barrier metal made of titanium or tantalum, and may be formed by depositing a metal layer after formation of the opening and by removing the excess portion by etching or CMP process. The deposition of the metal layer and the removal of the excess portion may be carried out simultaneously with the process for the plug 111 above. The opening of the insulating layer 303 may be formed by etching the insulating layer 303, where the insulating layer 107 may be utilized as an etching stopper. The insulating layer 303, in which the opening has been formed, is the insulating layer 119, wherein the insulating layer 119 includes the portion 119', and the upper surface of the plug 111 provided in the opening of the insulating layer 119 and connected to the semiconductor region 105, and the upper surfaces of the portions 112a and 112b may be formed substantially on the same plane. While in this case the opening is formed in the insulating layer 119 to form the portions 112a and 112b, the trench may be used.

Figure 3D:
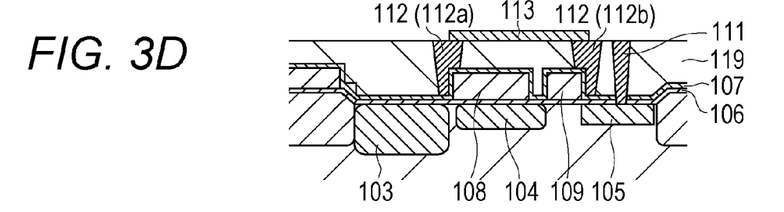

In the step illustrated in FIG. 3D, the second light-shielding portion 113 is formed. The second light-shielding portion 113, which is made of metal, is formed on the insulating layer 119, the portion 112a, and the portion 112b. In FIG. 3C, the second light-shielding portion 113 is formed, for example, by depositing a metal layer made of aluminum and by patterning the metal layer using photolithography and etching.

Figure 3E:
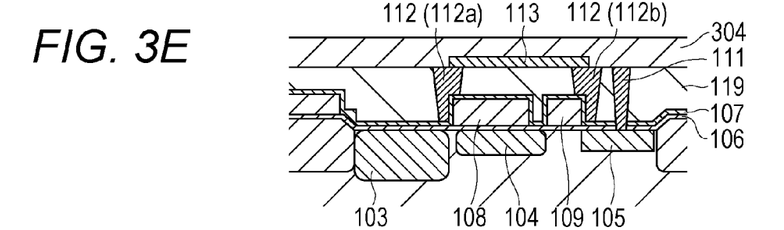

In the step illustrated in FIG. 3E, an insulating layer 304 is formed on the second light-shielding portion 113 and the insulating layer 119. For example, the insulating layer 304 is made of silicon oxide and is formed by plasma chemical vapor deposition (CVD).

Figure 3F:
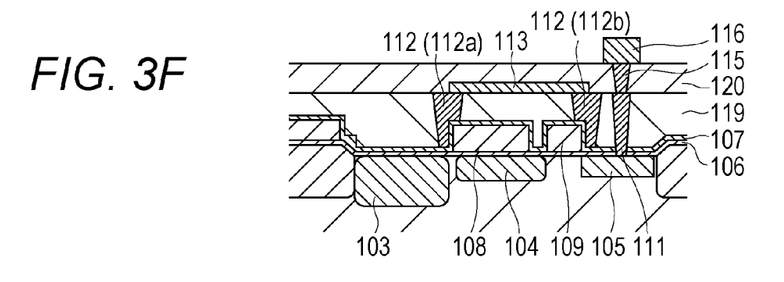

In the step illustrated in FIG. 3F, the plug 115 and the wiring 116 are formed. Specifically, removing a portion corresponding to the plug 111 of the insulating layer 304 illustrated in FIG. 3E by etching forms an opening, and providing metal in the opening forms the plug 115 connected to the plug 111. For example, the plug 115, as with the plug 111, is made of tungsten, includes a barrier metal made of titanium or tantalum, and may be formed by depositing a metal layer after formation of the opening and by removing the excess portion by etching or CMP process. The wiring 116 made of, for example, aluminum is formed on the plug 115. A method of forming the wiring 116 is the same as that of the second light-shielding portion 113. Thereafter, any part, such as an insulating layer or wiring, is formed by a method of manufacturing a conventional semiconductor, and thus the solid-state imaging device of the present embodiment is provided.

When the first light-shielding portion 112 is formed, the process of covering the surface of the opening with a thin insulating layer may be carried out before the metal is provided in the opening of the insulating layer. The process above may electrically isolate the first light-shielding portion 112 from the semiconductor substrate 100 more reliably. The process may also reduce contamination by the metal of the first light-shielding portion on the semiconductor substrate 100.

Note that the light-shielding portion of the present embodiment may also be applied to a configuration having no charge storage portion between the photoelectric converting portion and the FD portion, wherein the second light-shielding portion may be provided on the FD portion.

The second light-shielding portion is preferably in contact with the first light-shielding portion and is desirably formed on the same layer as the wiring of a wiring layer closest to the semiconductor substrate.

(Second Embodiment)

Figure 4A:
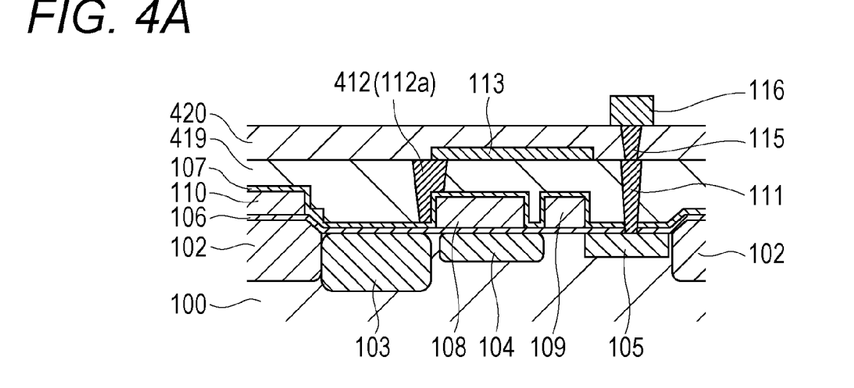
FIG. 4A is a schematic cross-sectional view illustrating a solid-state imaging device of a second embodiment.
Figure 4B:
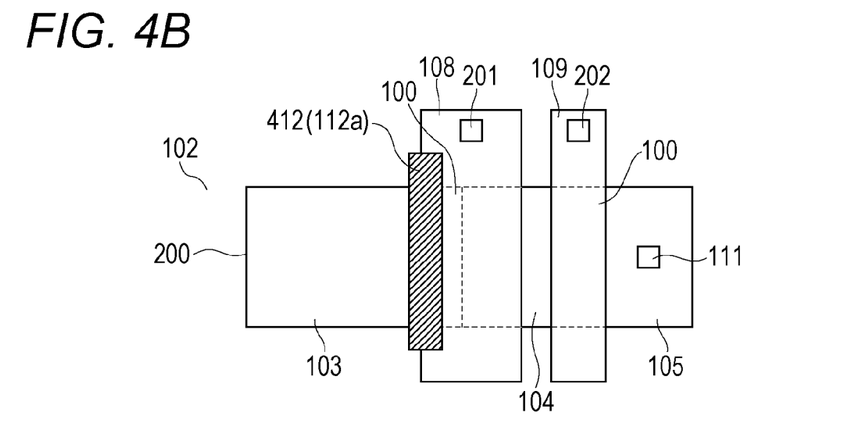
FIGS. 4B and 4C are schematic plan views illustrating the solid-state imaging device of the second embodiment.
Figure 4C:
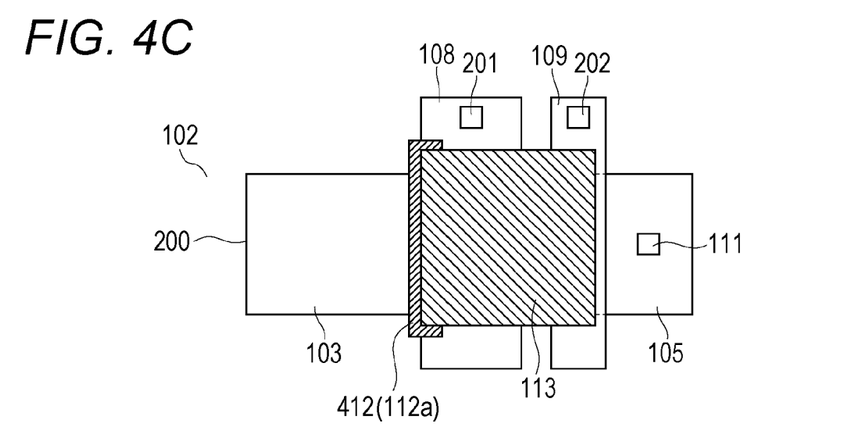

The solid-state imaging device of the present embodiment will be described with reference to FIGS. 4A, 4B, and 4C. FIGS. 4A, 4B, and 4C are drawings corresponding to FIGS. 1A, 2B, and 2C, respectively, where elements having the same functions are denoted by the same reference numerals and names, and their descriptions are omitted. The present embodiment differs from the first embodiment in terms of the shape of the first light-shielding portion. Specifically, a first light-shielding portion 412 of the present embodiment is disposed only between the semiconductor regions 103 and 104 as illustrated in FIGS. 4A and 4B. Such a configuration also may reduce light incident on the photoelectric converting portion entering the charge storage portion.

(Third Embodiment)

Figure 5A:
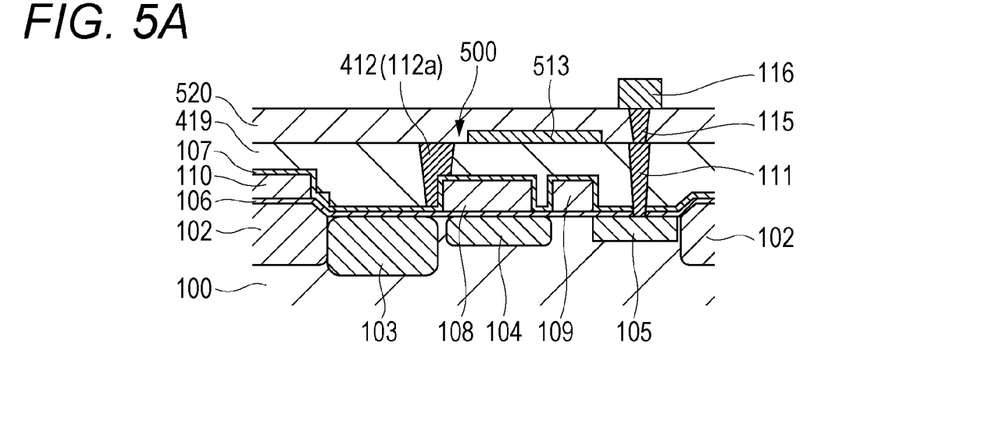
FIG. 5A is a schematic cross-sectional view illustrating a solid-state imaging device of a third embodiment.
Figure 5B:
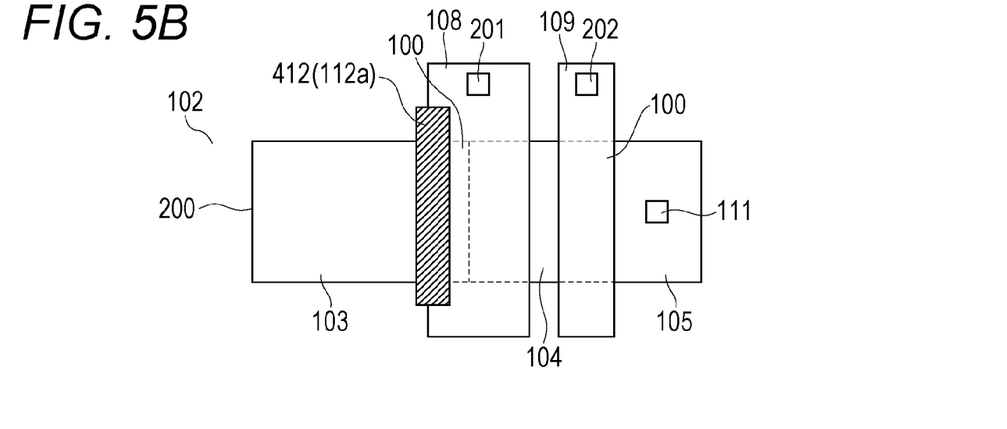
FIGS. 5B and 5C are schematic plan views illustrating the solid-state imaging device of the third embodiment.
Figure 5C:
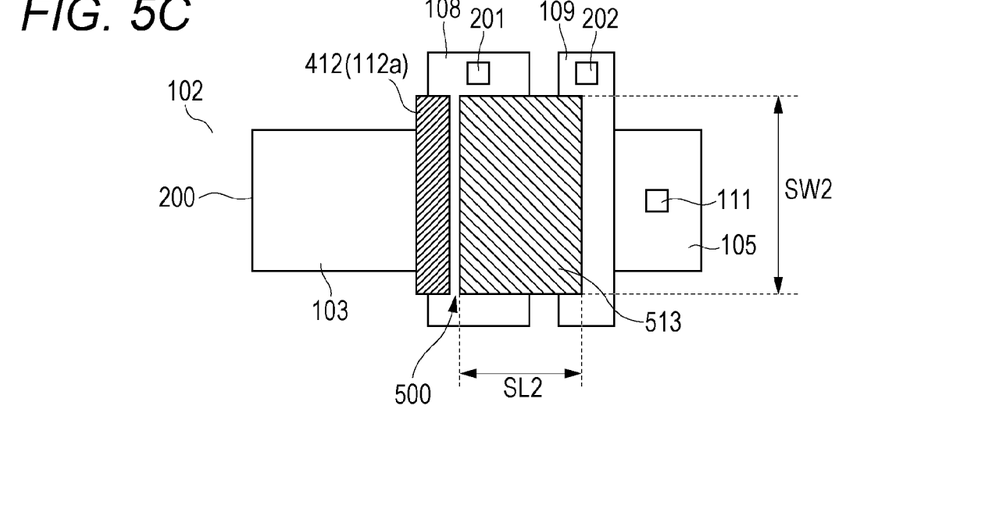

The solid-state imaging device of the present embodiment will be described with reference to FIGS. 5A, 5B, and 5C. FIGS. 5A, 5B, and 5C are drawings corresponding to FIGS. 4A, 4B, and 4C, respectively, where elements having the same functions are denoted by the same reference numerals and names, and their descriptions are omitted. The present embodiment differs from the second embodiment in terms of the shape and arrangement of the second light-shielding portion. Specifically, a second light-shielding portion 513 of the present embodiment, which has no contact with the first light-shielding portion 412, is provided with a gap 500. However, the first light-shielding portion 412 is provided between the semiconductor regions 103 and 104, and the second light-shielding portion 513 is provided on the charge storage portion, thus improving light-shielding performance.

(Fourth Embodiment)

Figure 6A:
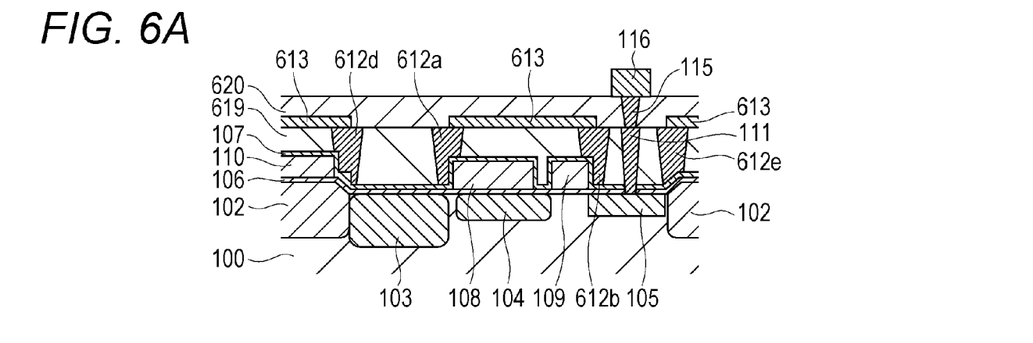
FIG. 6A is a schematic cross-sectional view illustrating a solid-state imaging device of a fourth embodiment.
Figure 6B:
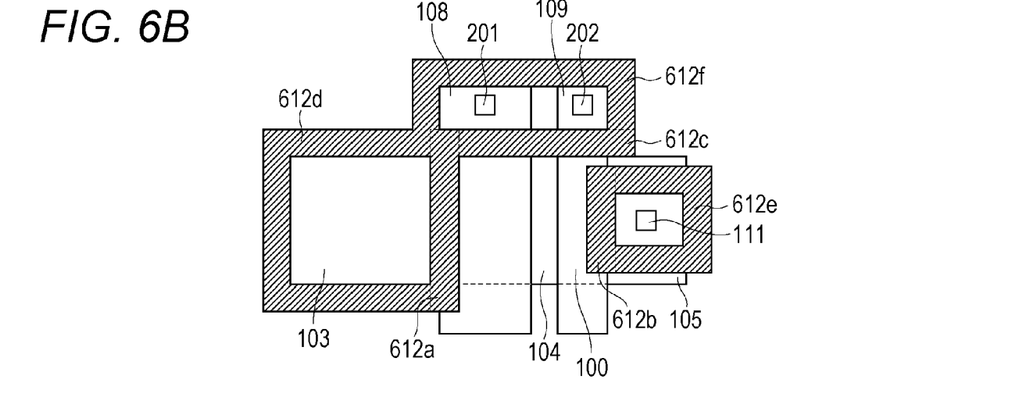
FIGS. 6B and 6C are schematic plan views illustrating the solid-state imaging device of the fourth embodiment.
Figure 6C:
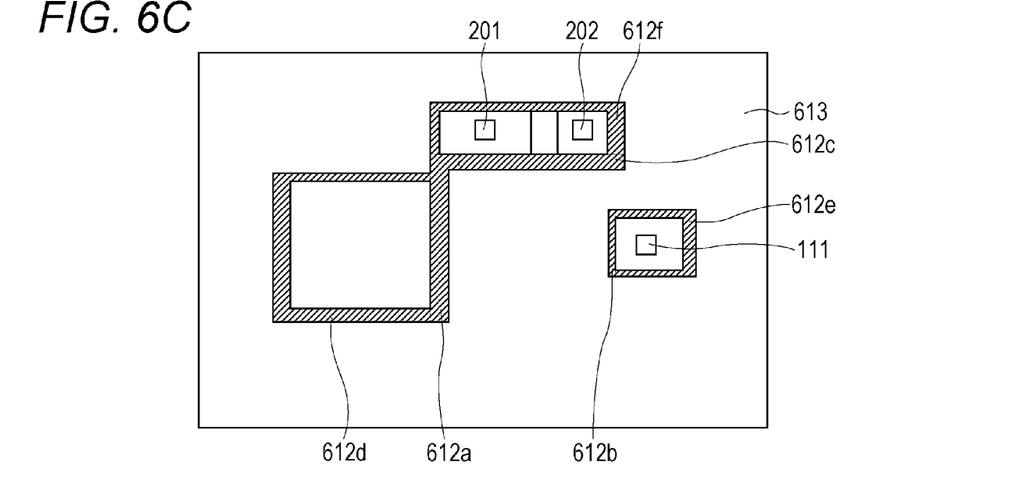

The solid-state imaging device of the present embodiment will be described with reference to FIGS. 6A, 6B, and 6C. FIGS. 6A, 6B, and 6C are drawings corresponding to FIGS. 4A, 4B, and 4C, respectively, where elements having the same functions are denoted by the same reference numerals and names, and their descriptions are omitted.

In the present embodiment, the configurations of a first light-shielding portion 612 and a second light-shielding portion 613 differ from those of the second embodiment etc. Specifically, as illustrated in FIG. 6B, the first light-shielding portion 612 includes a portion 612a provided between the semiconductor regions 103 and 104 and a portion 612b provided between the semiconductor regions 104 and 105. The first light-shielding portion 612 also includes a portion 612c provided between the semiconductor region 104 and the connections 201 and 202. The portion 612a is integral with a portion 612d, and the portions 612a and 612d surround the semiconductor region 103, the portions 612a and 612d being frame-shaped. The portion 612b is integral with a portion 612e, and the portions 612b and 612e surround the plug 111 of the FD portion, the portions 612b and 612e being frame-shaped. The portion 612c is integral with a portion 612f. The portions 612c and 612f are provided on the gate electrodes 108 and 109, and surround the connection 201 of the gate electrode 108 and the connection 202 of the gate electrode 109.

As illustrated in FIG. 6C, the second light-shielding portion 613 has openings corresponding to the semiconductor region 103, the connection 201, the connection 202, and the plug 111, and the remaining part thereof is continuously provided with a metal member.

Such a configuration may provide a solid-state imaging device having a higher light-shielding performance.

(Fifth Embodiment)

The solid-state imaging device of the present embodiment is capable of the image plane phase difference AF (Auto Focus). The solid-state imaging device of the present embodiment has image pickup pixels and focus detection pixels, each of the image pickup pixels and focus detection pixels being provided with a microlens. The focus detection pixels include at least two types of pixels (i.e., first pixels and second pixels), and the solid-state imaging device of the present embodiment may determine the degree of focusing by comparing a first image obtained by a plurality of first pixels with a second image obtained by a plurality of second pixels. Here, each of the microlenses, with which the image pickup pixels and the focus detection pixels are provided, condenses a light beam from the exit pupil of an imaging lens in an image capturing system such as a camera to form a real image of the exit pupil. The light beam incident on the microlens from one half of the exit pupil is condensed on one side of the real image, and the light beam incident on the microlens from the other half of the exit pupil is condensed on the other side of the real image. Here, since the focus detection pixel is provided with a light-shielding portion having a light opening corresponding to, for example, a half of the photoelectric converting portion, the light beam incident from a half of the exit pupil is blocked, and the light beam from another half is incident on the photoelectric converting portion. In the present embodiment, for example, the light beam from the right side of the exit pupil is incident on the first pixels. The structure of a focus detection pixel (first pixel) in the solid-state imaging device capable of such a focus detection will hereinafter be described with reference to FIGS. 7A, 7B, and 7C.

Figure 7A:
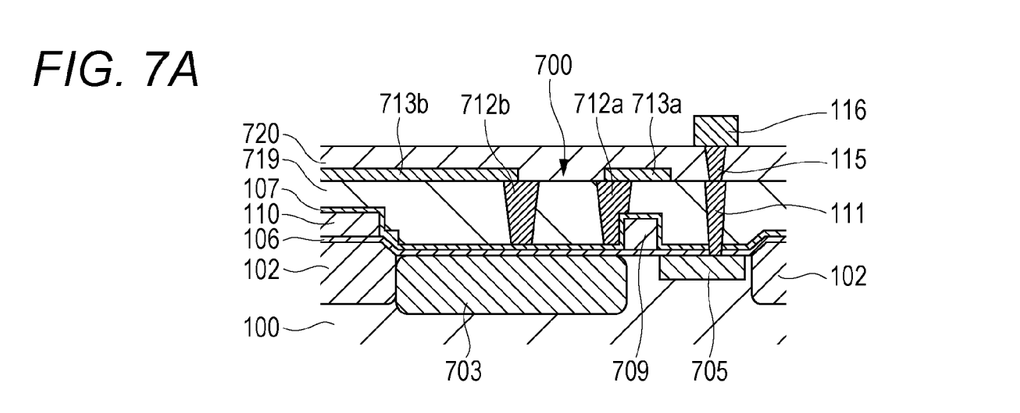
FIG. 7A is a schematic cross-sectional view illustrating a solid-state imaging device of a fifth embodiment.
Figure 7B:
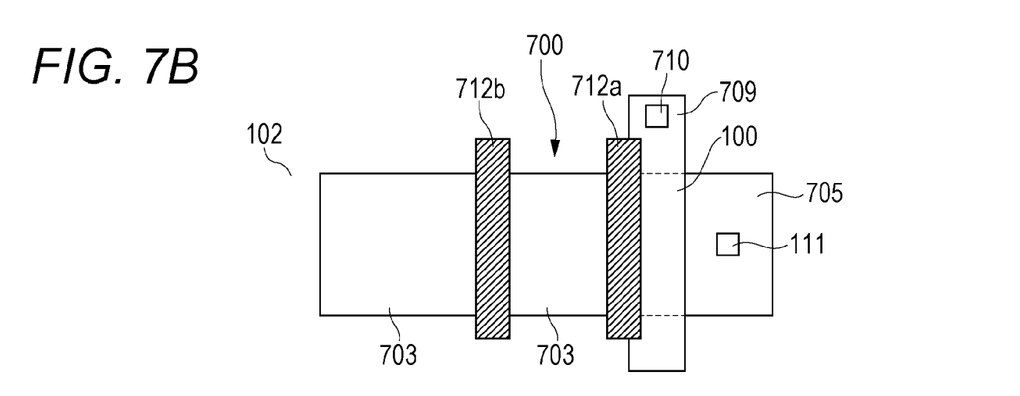
FIGS. 7B and 7C are schematic plan views illustrating the solid-state imaging device of the fifth embodiment.
Figure 7C:
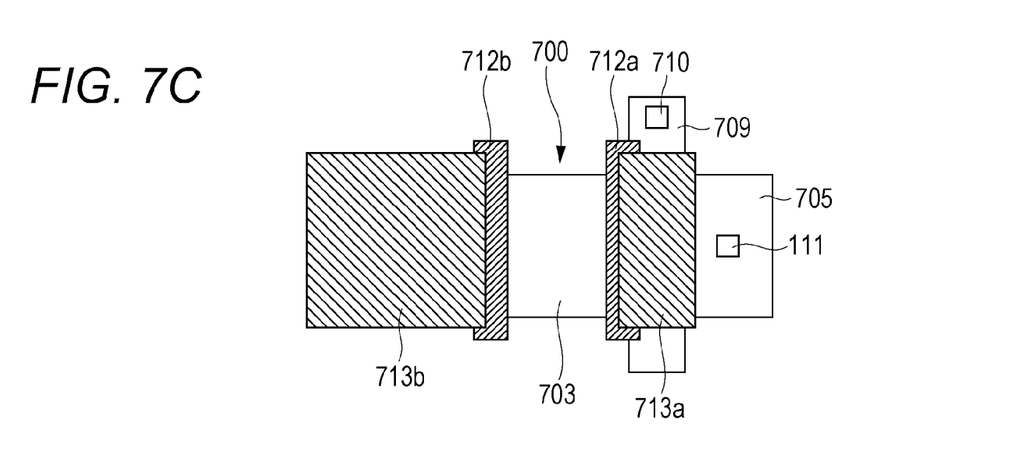

FIG. 7A is a schematic cross-sectional view for explaining the first pixel and illustrating the photoelectric converting portion, the FD portion and their periphery, and FIGS. 7B and 7C are schematic plan views for explaining the first pixel. FIG. 7B schematically illustrates a configuration that is provided with the first light-shielding portion 112, and FIG. 7C schematically illustrates a configuration in which the second light-shielding portion 113 is added to FIG. 7B. In FIGS. 7A, 7B, and 7C, elements having the same functions as those in other embodiments are denoted by the same reference numerals, and their descriptions are omitted.

In FIGS. 7A, 7B, and 7C, the semiconductor substrate 100 is provided with an n-type semiconductor region 703 constituting the photoelectric converting portion and being capable of signal charge accumulation and an n-type semiconductor region 705 constituting the FD portion. A gate electrode 709 is provided between the semiconductor regions 703 and 705. An insulating layer 719 made of, for example, BPSG is provided on the gate electrode 709. The plug 111 connected to the semiconductor region 705 and a first light-shielding portion 712 are provided in the opening of the insulating layer 719, wherein the first light-shielding portion 712 may be provided in the trench of the insulating layer 719. The first light-shielding portion 712 has a portion 712b provided at least near the center of the semiconductor regions 703, i.e., the photoelectric converting portion, and, in the present embodiment, includes a portion 712a provided between the semiconductor region 703 and the gate electrode 709. A second light-shielding portion 713 includes a portion 713b in contact with at least the portion 712b and provided on the semiconductor regions 703, i.e., the photoelectric converting portion. In the present embodiment, the second light-shielding portion 713 includes a portion 713a in contact with the portion 712a and provided on the gate electrode 709.

In the present embodiment, the first light-shielding portion 712 and the second light-shielding portion 713 form a light opening 700 for focus detection for adjusting light incident on the semiconductor regions 703. The light opening may be slit-shaped instead of a closed-loop shape as illustrated in FIG. 7B. Signals of a pupil-divided image may be obtained through the light opening, whereby focus detection may be accomplished. The first and second light-shielding portions may reduce unnecessary light entering the semiconductor regions 703 and 705, thereby improving the accuracy of focus detection. Thus, the first and second light-shielding portions are useful to shield the photoelectric converting portion for focus detection. Note that a connection 710 is to connect the gate electrode 709 and the plug.

The center position of the light opening 700 in the pixel for focus detection is offset from the center of the photoelectric converting portion on a plane parallel to the light-receiving surface in order to divide the image. The first pixel described herein has a light opening offset to the right side of the photoelectric converting portion as illustrated in FIG. 7C. The first image is formed by signals from a plurality of the first pixels. Contrary to the first pixel, the second pixel has a light opening offset to the left side of the photoelectric converting portion in the plane of FIG. 7C. The second image is formed by signals from a plurality of the second pixels. The degree of focusing is determined for focus detection by measuring the amount of displacement between the peak positions of the first and second images. The first and second images have been those on the right and left of the exit pupil, respectively; however, the first and second images may be those arranged vertically, may be those compared to each other, and may be one- or two-dimensional images.

An image capturing system in which the solid-state imaging device is incorporated will now be exemplarily described as applications of the solid-state imaging device according to the embodiments above. The concept of the image capturing system includes not only devices, such as still cameras and camcorders, whose primary purpose is to capture images, but also devices having an auxiliary imaging function (e.g., personal computers and mobile terminals). The image capturing system includes the solid-state imaging device, which has been described as the exemplary embodiments, and a processing unit for processing signals from the solid-state imaging device. The processing unit may include, for example, a processor for processing digital data. If a focus detection signal is output from the solid-state imaging device, the processing unit may further be provided with a focus detection processing unit. A signal from the focus detection processing unit may adjust focusing of an optical system.

The solid-state imaging device is applied to the image capturing system in the manner described above. The use of the solid-state imaging device, which has a high light-shielding performance, may inhibit stray light, thereby improving the accuracy of the image signals or the focus detection signals obtained. Improvement of the accuracy of the obtained signals facilitates image processing in a signal processing circuit. Thus, a configuration such as the signal processing circuit of the image capturing system may be simplified.

The embodiments described above may be modified or combined appropriately.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2012-220386, filed Oct. 2, 2012, which is hereby incorporated by reference herein in its entirety.

What is claimed is:

1. A solid-state imaging device comprising:
    a photoelectric converting portion including a first semiconductor region capable of accumulating a signal charge;
    a second semiconductor region of same conductivity type as the first semiconductor region;
    a gate electrode provided between the first and second semiconductor regions;
    an insulating layer provided on the first semiconductor region, the second semiconductor region, and the gate electrode;
    a first light-shielding portion including a metal portion provided in an opening or a trench of the insulating layer between the first and second semiconductor regions; and
    a second light-shielding portion including a metal portion that is provided on the insulating layer on the second semiconductor region and has a lower surface in contact with the upper surface of the insulating layer.

2. The solid-state imaging device according to claim 1, further comprising:

a third semiconductor region; and another gate electrode different from the gate electrode provided between the second and third semiconductor regions.

3. The solid-state imaging device according to claim 2, wherein
the first light-shielding portion includes a metal portion provided in an opening or a trench of the insulating layer between the second and third semiconductor regions.

4. The solid-state imaging device according to claim 2, wherein
the first light-shielding portion includes a metal portion provided in an opening or a trench of the insulating layer so as to surround the second semiconductor region, and
the orthogonal projection of the first light-shielding portion onto a plane containing the light receiving surface of the photoelectric converting portion surrounds the second semiconductor region, the orthogonal projection being frame-shaped.

5. The solid-state imaging device according to claim 2, further comprising
a plug that is provided in the opening of the insulating layer and is connected to the third semiconductor region,
the upper surface of the first light-shielding portion and the upper surface of the plug being formed substantially on the same plane.

6. The solid-state imaging device according to claim 5, further comprising:
another insulating layer provided on the insulating layer; and
another plug that is provided in an opening of the another insulating layer and is connected to the plug.

7. The solid-state imaging device according to claim 1, wherein
the first light-shielding portion also extends over the photoelectric converting portion.

8. The solid-state imaging device according to claim 1, wherein
the opening of the insulating layer is provided with a plug connected to the gate electrode, and
the first light-shielding portion includes a metal portion provided in an opening or a trench of the insulating layer between the plug and the second semiconductor region.

9. The solid-state imaging device according to claim 1, wherein
the insulating layer is made of silicon oxide.

10. The solid-state imaging device according to claim 1, wherein
the first light-shielding portion is made of tungsten, and
the second light-shielding portion is made of aluminum.

11. The solid-state imaging device according to claim 1, wherein
the second light-shielding portion is electrically floating.

12. An image capturing system comprising:
the solid-state imaging device according to claim 1; and
a processing unit configured to process a signal from the solid-state imaging device.

13. A solid-state imaging device comprising:
a photoelectric converting portion for focus detection;
a floating diffusion portion to which electric carriers are transferred from the photoelectric converting portion;
a gate electrode provided between the photoelectric converting portion and the floating diffusion portion;
an insulating layer provided on the photoelectric converting portion, the floating diffusion portion, and the gate electrode;
a first light-shielding portion including a metal portion provided in a trench or an opening of the insulating layer on the photoelectric converting portion; and
a second light-shielding portion that is provided on the insulating layer, has a lower surface in contact with the upper surface of the insulating layer, includes a metal portion provided on the photoelectric converting portion, and forms an opening for the focus detection.

14. An image capturing system comprising:
the solid-state imaging device according to claim 13; and
a processing unit configured to process a signal from the solid-state imaging device.

* * * * *